(12) United States Patent
Ota et al.

(10) Patent No.: US 10,374,143 B2
(45) Date of Patent: Aug. 6, 2019

(54) SEMICONDUCTOR INTEGRATED CIRCUIT, AND SENSOR SYSTEM AND VEHICLE INCLUDING THE SAME

(71) Applicant: Rohm Co., Ltd., Kyoto (JP)

(72) Inventors: Akihiro Ota, Kyoto (JP); Yuzo Mizushima, Kyoto (JP); Yuji Kaneda, Kyoto (JP); Isao Niwa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 145 days.

(21) Appl. No.: 15/691,993

(22) Filed: Aug. 31, 2017

(65) Prior Publication Data

US 2018/0069169 A1    Mar. 8, 2018

(30) Foreign Application Priority Data

Sep. 5, 2016    (JP) ................... 2016-172667

(51) Int. Cl.
| | |
|---|---|
| *H01L 41/22* | (2013.01) |
| *H01L 41/09* | (2006.01) |
| *G01H 11/08* | (2006.01) |
| *H02N 2/18* | (2006.01) |
| *H01L 41/04* | (2006.01) |
| *H01L 41/113* | (2006.01) |

(52) U.S. Cl.
CPC .......... *H01L 41/1132* (2013.01); *G01H 11/08* (2013.01); *H01L 41/042* (2013.01); *H01L 41/09* (2013.01); *H01L 41/22* (2013.01); *H02N 2/181* (2013.01)

(58) Field of Classification Search
CPC ....... H01L 41/1132; H01L 41/22; H01L 41/09
USPC ........................................................... 73/649
See application file for complete search history.

(56) References Cited

U.S. PATENT DOCUMENTS

| | | | | |
|---|---|---|---|---|
| 6,111,288 A | * | 8/2000 | Watanabe | H01L 27/115 257/290 |
| 6,166,577 A | * | 12/2000 | Mizuno | H03K 19/00384 327/155 |
| 2001/0043103 A1 | * | 11/2001 | Uehara | H03K 5/151 327/175 |

(Continued)

FOREIGN PATENT DOCUMENTS

JP    2012-225723    11/2012

*Primary Examiner* — Jacques M Saint Surin
(74) *Attorney, Agent, or Firm* — Fish & Richardson P.C.

(57) ABSTRACT

A semiconductor integrated circuit constituting a part of a sensor signal processing apparatus for processing sensor signal output from a sensor includes: a first terminal where one end of a vibrator externally attached to the semiconductor integrated circuit is connected and a second terminal where the other end of the vibrator is connected; and an oscillation circuit oscillating the vibrator connected via the first and second terminals, wherein the oscillator circuit intermittently oscillating the vibrator based on control signal, wherein a first period where the oscillation circuit oscillates the vibrator and a second period where the oscillation circuit does not oscillate the vibrator are alternately switched, wherein, during the first period, potentials of the first and second terminals are alternately switched complementarily to high level and low level, and wherein, during the second period, the potentials of the first terminal and the second terminal are fixed to the low level.

12 Claims, 5 Drawing Sheets

(56) References Cited

U.S. PATENT DOCUMENTS

| | | | | |
|---|---|---|---|---|
| 2007/0205830 A1* | 9/2007 | Itagaki | ............... | G06F 1/04 331/2 |
| 2008/0297202 A1* | 12/2008 | Takita | ............... | H03K 5/19 327/42 |
| 2013/0249720 A1* | 9/2013 | Matsuura | ............ | H03M 1/1038 341/118 |

* cited by examiner

SEMICONDUCTOR INTEGRATED CIRCUIT, AND SENSOR SYSTEM AND VEHICLE INCLUDING THE SAME

CROSS-REFERENCE TO RELATED APPLICATION

This application is based upon and claims the benefit of priority from Japanese Patent Application No. 2016-172667, filed on Sep. 5, 2016, the entire contents of which are incorporated herein by reference.

TECHNICAL FIELD

The present disclosure relates to a semiconductor integrated circuit used to process a sensor signal.

BACKGROUND

A sensor signal processing apparatus that processes a sensor signal output from a sensor generally has a configuration including an oscillator. Further, the oscillator used in the sensor signal processing apparatus usually has a configuration including a piezoelectric vibrator. Therefore, the general sensor signal processing apparatus has a configuration including a semiconductor integrated circuit and a piezoelectric vibrator externally attached to the semiconductor integrated circuit.

In the semiconductor integrated circuit described above, for example, there is a demand that a primary battery is used as a power source for the semiconductor integrated circuit and the semiconductor integrated circuit can be operated for a long period of time (for example, 10 years or the like) without replacing the battery. In order to satisfy such demand, it is necessary to reduce the power consumption of the semiconductor integrated circuit.

As a method for achieving low power consumption of the semiconductor integrated circuit, intermittently operating the semiconductor integrated circuit is considered. In the case of intermittently operating the semiconductor integrated circuit, the more the low power consumption is promoted, the longer a period during which the operation of the semiconductor integrated circuit is stopped. Therefore, in the case of intermittently operating the semiconductor integrated circuit, it is important that the semiconductor integrated circuit does not adversely affect a piezoelectric vibrator when the operation of the semiconductor integrated circuit is stopped, in order to prolong a lifespan of the piezoelectric vibrator externally attached to the semiconductor integrated circuit.

In some cases, a sensor such as an acceleration sensor or an angular velocity sensor incorporates a piezoelectric vibrator or a silicon vibrator formed by using a micro electro mechanical systems (MEMS) technology therein and performs sensing using vibration of the vibrator, the semiconductor integrated circuit includes an oscillation circuit that oscillates the vibrator incorporated in the sensor, and the sensor signal processing apparatus processes a sensor signal output from the sensor. In these cases, it is also important that the semiconductor integrated circuit does not adversely affect the vibrator incorporated in the sensor when the operation of the semiconductor integrated circuit is stopped, in order to prolong a lifespan of the vibrator incorporated in the sensor and externally attached to the semiconductor integrated circuit.

SUMMARY

Some embodiments of the present disclosure provide a semiconductor integrated circuit which is used to process a sensor signal and performs an intermittent operation, and which can prolong a lifespan of an externally attached vibrator, and a sensor system and a vehicle using the same.

According to one aspect of the present disclosure, there is provided a semiconductor integrated circuit constituting a part of a sensor signal processing apparatus for processing a sensor signal output from a sensor. The circuit includes: a first terminal to which one end of a vibrator externally attached to the semiconductor integrated circuit is connected and a second terminal to which the other end of the vibrator is connected; and an oscillation circuit configured to oscillate the vibrator connected via the first terminal and the second terminal, wherein the oscillator circuit is configured to intermittently oscillate the vibrator based on a control signal, wherein a first period during which the oscillation circuit oscillates the vibrator and a second period during which the oscillation circuit does not oscillate the vibrator are alternately switched, wherein, during the first period, potentials of the first terminal and the second terminal are alternately switched complementarily to a high level and a low level, and wherein, during the second period, the potentials of the first terminal and the second terminal are fixed to the low level.

In some embodiments, the first period may be shorter than the second period.

In some embodiments, the sensor signal processing apparatus may be configured to process the sensor signal a plurality of times during the first period.

In some embodiments, the oscillation circuit may be configured to oscillate the vibrator to generate the clock signal.

In some embodiments, a length of one first period may be determined based on the clock signal.

In some embodiments, the vibrator may be incorporated in the sensor.

In some embodiments, a start timing of the first period may be determined based on a trigger signal supplied from the outside of the semiconductor integrated circuit to the semiconductor integrated circuit.

In some embodiments, the oscillation circuit includes: an NAND circuit; a first switch installed between an output terminal of the NAND circuit and the second terminal; a second switch installed between a portion where a potential is fixed to the low level and the second terminal; and a resistor whose one end is connected to the first terminal and other end is connected to the second terminal, and wherein during the first period, the first switch is turned on and the second switch is turned off, and wherein, during the second period, the first switch is turned off and the second switch is turned on.

In some embodiments, the first switch and the second switch may be controlled based on the control signal.

In some embodiments, the NAND circuit may be a CMOS type NAND circuit.

According to another aspect of the present disclosure, a sensor system is provided. The sensor system includes: a sensor; and a sensor signal processing apparatus comprising the semiconductor integrated circuit and configured to process a sensor signal output from the sensor.

According to another aspect of the present disclosure, a vehicle including the sensor system is provided.

DETAILED DESCRIPTION

<Sensor System>

Figure 1:
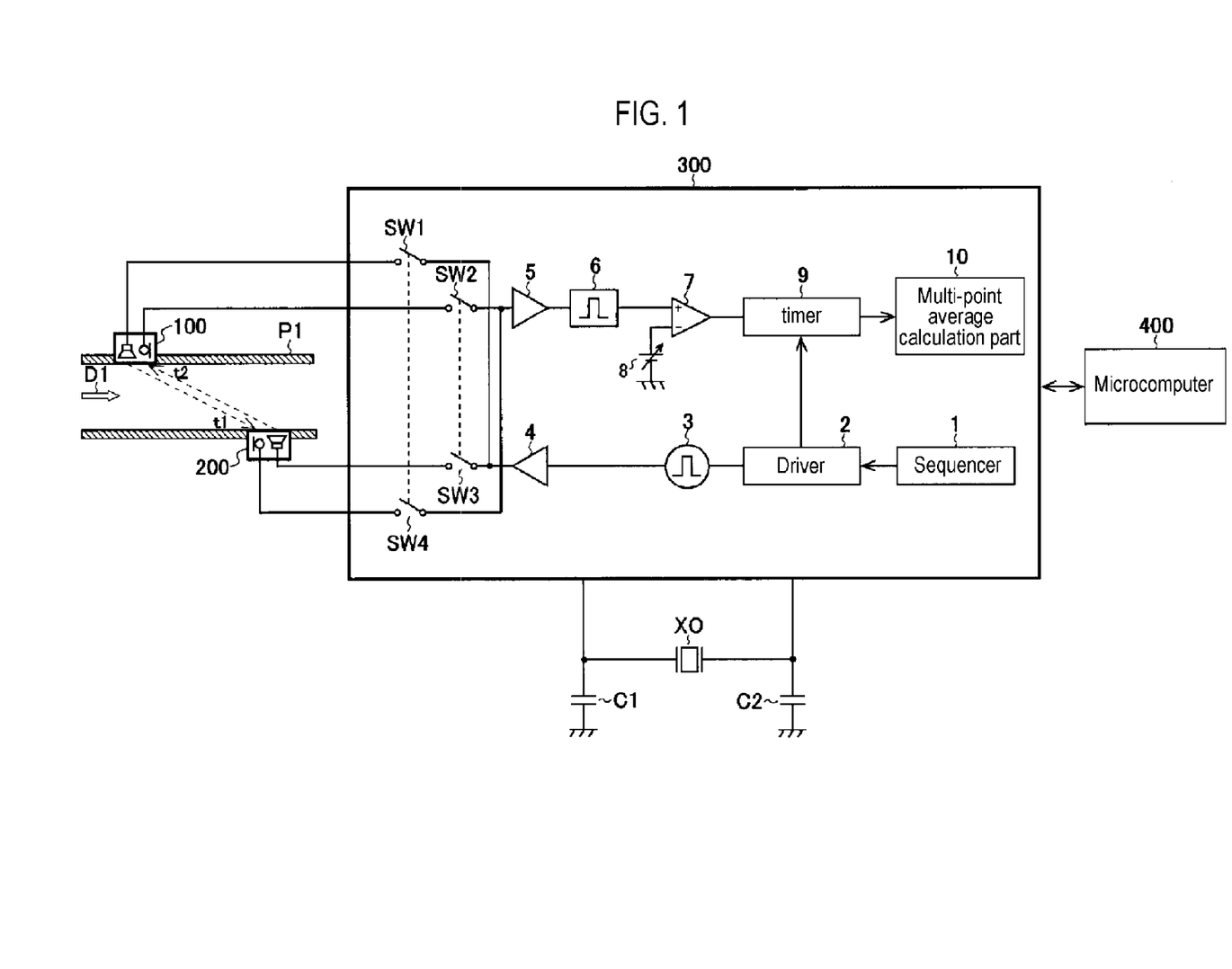
FIG. 1 is a diagram illustrating one configuration example of a sensor system.

FIG. 1 is a diagram illustrating one configuration example of a sensor system. The sensor system illustrated in FIG. 1 includes ultrasonic sensors 100 and 200 and a sensor signal processing apparatus. The sensor signal processing apparatus includes a semiconductor integrated circuit 300 and an element externally attached to the semiconductor integrated circuit 300, and processes a sensor signal output from each of the ultrasonic sensors 100 and 200. The semiconductor integrated circuit 300 is connected to a microcomputer 400, and outputs the result of processing the sensor signal to the microcomputer 400.

The ultrasonic sensors 100 and 200 are installed in a pipe P1. An installation position of the ultrasonic sensor 100 and an installation position of the ultrasonic sensor 200 are deviated from each other in an axial direction D1 of the pipe P1. A fluid flows through the pipe P1 along the axial direction D1 of the pipe P1. The sensor signal processing apparatus measures a flow rate of the fluid flowing through the pipe P1 based on a difference between a time t1 and a time t2. The time t1 is a time until an ultrasonic wave transmitted from the ultrasonic sensor 100 is received by the ultrasonic sensor 200. The time t2 is a time until an ultrasonic wave transmitted from the ultrasonic sensor 200 is received by the ultrasonic sensor 100.

The semiconductor integrated circuit 300 includes a sequencer 1, a driver 2, a pulse signal generating circuit 3, an amplifier 4, a variable gain amplifier 5, a waveform shaping circuit 6, a comparator 7, a variable voltage source 8, a timer 9, and a multi-point average calculation part 10.

The semiconductor integrated circuit 300 includes an oscillation circuit. A clock signal is generated by the oscillation circuit, a piezoelectric vibrator XO which is an external component, and condensers C1 and C2. The clock signal is used as an operation reference of the timer 9 or the like in the semiconductor integrated circuit 300. Details of the oscillation circuit will be described below.

The driver 2 operates the pulse signal generating circuit 3 and the timer 9 based on a command from the sequencer 1.

The pulse signal generating circuit 3 generates a pulse signal string and outputs the same to the amplifier 4. The pulse signal string amplified by the amplifier 4 is supplied to the ultrasonic sensor 100 when a switch SW1 is turned on, and is supplied to the ultrasonic sensor 200 when a switch SW3 is turned on. The ultrasonic sensors 100 and 200 transmit an ultrasonic wave based on the pulse signal string transmitted from the amplifier 4. Here, since the ultrasonic sensor 100 is installed on an upstream side of the fluid flow and the ultrasonic sensor 200 is installed on a downstream side of the fluid flow, in the following descriptions, the ultrasonic sensor 100 will be referred to as an upstream side ultrasonic sensor 100 and the ultrasonic sensor 200 will be referred to as a downstream side ultrasonic sensor 200.

Upon receipt of the ultrasonic wave, the upstream side ultrasonic sensor 100 and the downstream side ultrasonic sensor 200 output a high-frequency signal based on the received ultrasonic wave. When a switch SW2 is turned on, the high-frequency signal output from the upstream side ultrasonic sensor 100 is supplied to the variable gain amplifier 5, and when a switch SW4 is turned on, the high-frequency signal output from the downstream side ultrasonic sensor 200 is supplied to the variable gain amplifier 5. The high-frequency signal amplified by the variable gain amplifier 5 is waveform-shaped by the waveform shaping circuit 6 and converted into a pulse signal string. The comparator 7 compares the pulse signal string output from the waveform shaping circuit 6 with an output voltage from the variable voltage source 8, and outputs the comparison result to the timer 9. Based on an output signal from the comparator 7, the timer 9 measures a difference between the time t1 and the time t2 described above. The multi-point average calculation part 10 calculates an average value of the differences between the time t1 and the time t2 measured by the timer 9 and obtains a flow rate of a fluid flowing through the pipe P1 based on the calculation result.

The switches SW1 and SW4 and the switches SW2 and SW3 complementarily switch between an ON state and an OFF state based on a command from the sequencer 1.

Figure 2:
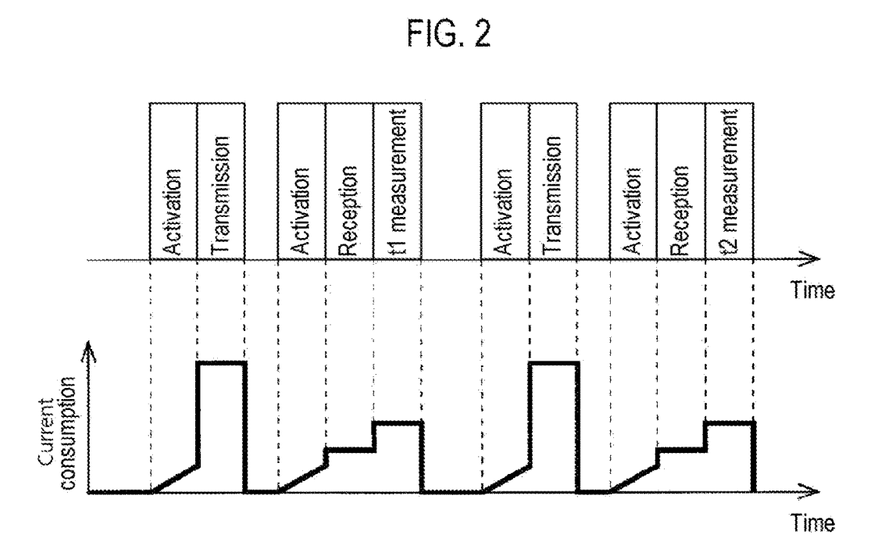
FIG. 2 is a time chart illustrating a procedure for measuring a flow rate.

FIG. 2 is a time chart illustrating a procedure for measuring a flow rate of a fluid flowing through the pipe P1.

(Upstream Side Transmission)

First, a function part (a transmission function part) necessary for transmitting a pulse signal string of the semiconductor integrated circuit 300 is activated, a pulse signal string including a plurality of pulses is transmitted after completing the activation, and the transmission function part is turned off after completing the transmission of the pulse signal string.

(Upstream Side Reception)

Thereafter, a function part (reception function part) necessary for receiving a high-frequency signal of the semiconductor integrated circuit 300 and a function part (measurement function part) necessary for measuring a difference of the semiconductor integrated circuit 300 are activated, a high-frequency signal including a plurality of extreme values and measurement at a time t1 are sequentially received after completing the activation, and the reception function part and the measurement function part are turned off after completing the measurement at the time t1.

(Downstream Side Transmission)

Further, thereafter, the transmission function part is activated again, and a pulse signal string including a plurality of pulses is transmitted after completing the activation, and the transmission function part is turned off after completing the transmission of the pulse signal string.

(Downstream Side Reception)

Further, thereafter, the reception function part and the measurement function part are activated again, a high-frequency signal including a plurality of extreme values after completing the activation and measurement at a time t2 are sequentially received, and the reception function part and the measurement function part are turned off after completing the measurement at the time t2.

Since the transmission function part, the reception function part, and the measurement function part are turned on only when necessary, it is possible to suppress current consumption of the transmission function part, the reception function part, and the measurement function part as illustrated in FIG. 2, and to achieve low power consumption.

Figure 3:
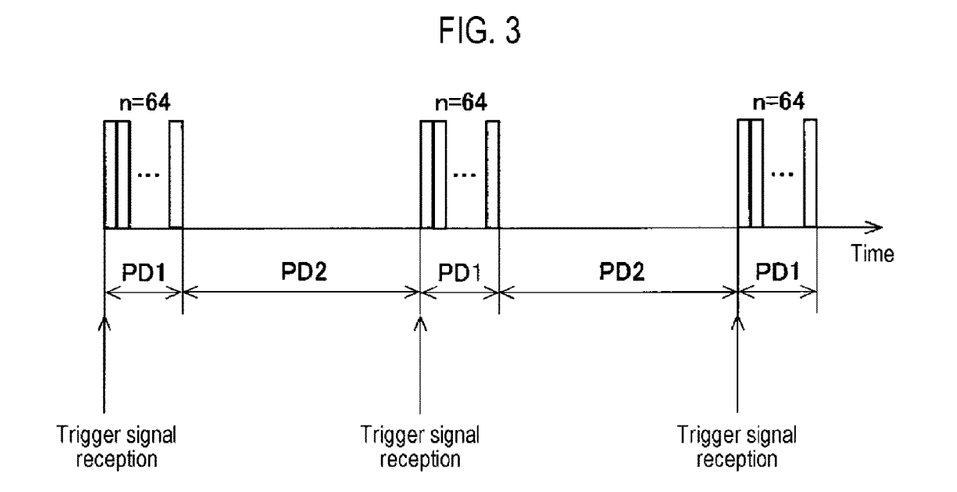
FIG. 3 is a time chart illustrating an intermittent operation.

FIG. 3 is a time chart illustrating an intermittent operation. The semiconductor integrated circuit 300 alternately switches between a first period PD1 during which the oscillation circuit generates a clock signal and a second period PD2 during which the oscillation circuit does not generate a clock signal.

By such intermittent operation of the oscillation circuit, it is possible to achieve low power consumption. From the viewpoint of increasing a reduction amount of power consumption due to the intermittent operation of the oscillation circuit, the first period PD1 may be set to be shorter than the second period PD2 in some embodiments. Thus, in the present embodiment, the length of one first period PD1 is set at 500 µs and the length of one second period PD2 is set at 1.5 ms. Further, these numerical values are merely examples, and other numerical values may be of course employed.

During one first period PD1, a pair of measurements at the times t1 and t2 illustrated in FIG. 2 are repeated 64 times (where n=64). The pair of measurements at the times t1 and t2 and 64 and the repetition illustrated in FIG. 2 are executed based on the clock signal generated by the oscillator circuit. Therefore, the length of one first period PD1 is determined based on the clock signal generated by the oscillation circuit.

The microcomputer 400 transmits a trigger signal to the semiconductor integrated circuit 300 on a cycle of 2 seconds. The semiconductor integrated circuit 300 starts the period PD1 at the timing of receiving the trigger signal. That is, the trigger signal transmitted from the microcomputer 400 to the semiconductor integrated circuit 300 is a wake-up signal for the semiconductor integrated circuit 300. Further, the semiconductor integrated circuit 300 calculates an average value of the differences between the time t1 and the time t2 and also performs the process of obtaining a flow rate of a fluid flowing through the pipe P1, based on the calculation result, within the period PD1.

First Example of Oscillation Circuit

Figure 4:
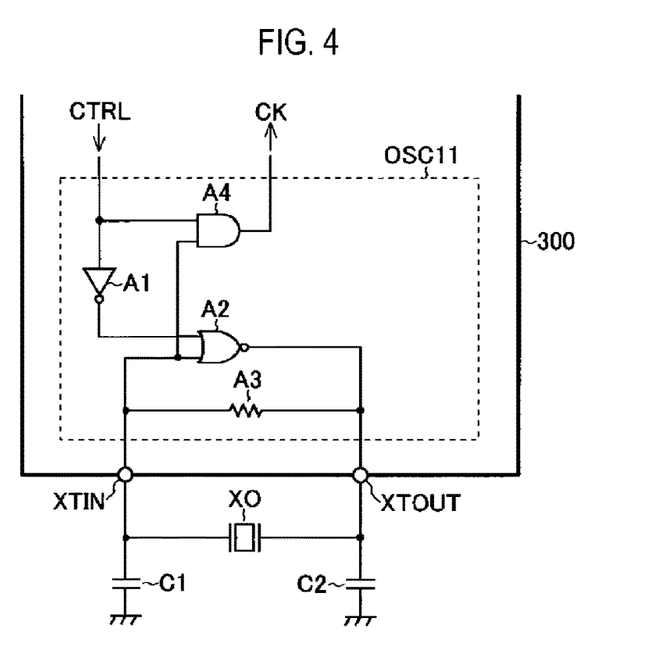
FIG. 4 is a diagram illustrating a first example of an oscillation circuit.

FIG. 4 is a diagram illustrating a first embodiment of the oscillation circuit installed in the semiconductor integrated circuit 300. An oscillation circuit OSC11 includes a configuration including a NOT circuit A1, a NOR circuit A2, a resistor A3, and an AND circuit A4.

A control signal CTRL is supplied to an input terminal of the NOT circuit A1 and a first input terminal of the AND circuit A4. The control signal CTRL is a signal generated in the semiconductor integrated circuit 300, has a high level during the first period PD1 described above, and has a low level during the second period PD2 described above. Therefore, the control signal CTRL is generated based on, for example, a clock signal CK and a trigger signal output from the microcomputer 400.

An output terminal of the NOT circuit A1 is connected to a first input terminal of the NOR circuit A2. A second input terminal of the NOR circuit A2 is connected to a second input terminal of the AND circuit A4, one end of the resistor A3, and a terminal XTIN. An output terminal of the NOR circuit A2 is connected to the other end of the resistor A3 and a terminal XTOUT.

One end of a piezoelectric vibrator XO which is an external component and one end of a condenser C1 which is an external component are connected to the terminal XTIN of the semiconductor integrated circuit 300. Further, the other end of the piezoelectric vibrator XO and one end of a condenser C2 which is an external component are connected to the terminal XTOUT of the semiconductor integrated circuit 300. The potentials of the other ends of the condensers C1 and C2 are fixed to a low level (typically, a ground potential).

The oscillation circuit OSC11 oscillates the piezoelectric vibrator XO to generate the clock signal CK and outputs the same from the output terminal of the AND circuit A4. Further, the oscillation circuit OSC11 intermittently generates the clock signal CK based on the control signal CTRL. That is, when the control signal CTRL has a high level, the oscillation circuit OSC11 is enabled to generate the clock signal CK. When the control signal CTRL has a low level, the oscillation circuit OSC11 is disabled not to generate the clock signal CK.

When the oscillation circuit OSC11 is disabled, the output terminal of the AND circuit A4, the terminal XTIN, and the terminal XTOUT are fixed to a low level.

Figure 5:
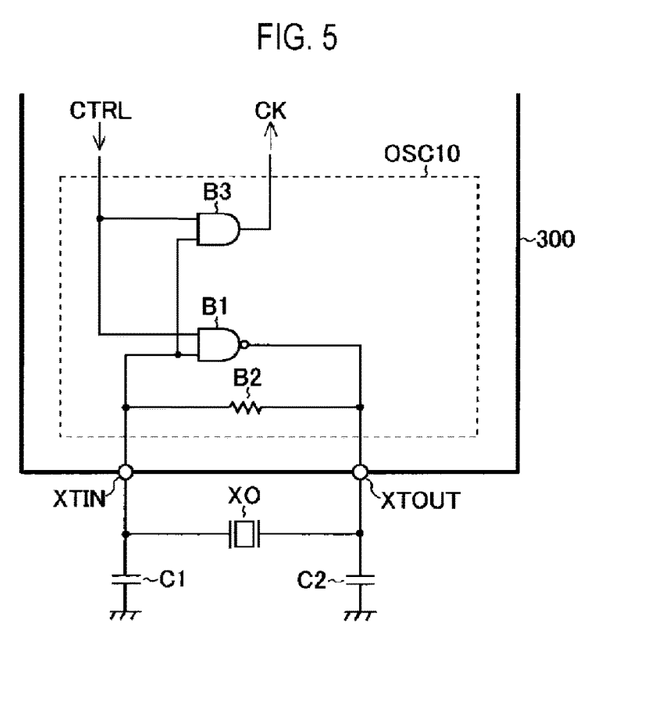
FIG. 5 is a diagram illustrating a comparative example of the oscillation circuit.

Next, the effects of the oscillation circuit OSC11 will be described while comparing with a comparative example. FIG. 5 is a diagram illustrating a comparative example of the oscillation circuit installed in the semiconductor integrated circuit 300. An oscillation circuit OSC10 has a configuration including an NAND circuit B1, a resistor B2, and an AND circuit B3.

A control signal CTRL is supplied to a first input terminal of the NAND circuit B1 and a first input terminal of the AND circuit B3. The control signal CTRL is a signal generated in the semiconductor integrated circuit 300, has a high level during the first period PD1 described above, and has a low level during the second period PD2 described above. Therefore, the control signal CTRL is generated based on, for example, a clock signal CK and a trigger signal output from the microcomputer 400.

A second input terminal of the NAND circuit B1 is connected to a second input terminal of the AND circuit B3, one end of the resistor B2, and a terminal XTIN. An output terminal of the NAND circuit B1 is connected to the other end of the resistor B2 and a terminal XTOUT.

One end of a piezoelectric vibrator XO which is an external component and one end of a condenser C1 which is an external component are connected to the terminal XTIN of the semiconductor integrated circuit 300. Further, the other end of the piezoelectric vibrator XO and one end of a condenser C2 which is an external component are connected to the terminal XTOUT of the semiconductor integrated circuit 300. The potentials of the other ends of the condensers C1 and C2 are fixed to a low level (typically, a ground potential).

The oscillation circuit OSC10 oscillates the piezoelectric vibrator XO to generate the clock signal CK, and outputs the same from the output terminal of the AND circuit B3. Further, the oscillation circuit OSC10 intermittently generates the clock signal CK based on the control signal CTRL. That is, when the control signal CTRL has a high level, the oscillation circuit OSC10 is enabled to generate the clock signal CK, and when the control signal CTRL has a low level, the oscillation circuit OSC10 is disabled and does not generate the clock signal CK.

When the oscillation circuit OSC10 is disabled, the output terminal of the AND circuit B3 is fixed to a low level, and the terminals XTIN and XTOUT are fixed to a high level.

In the case of using the oscillation circuit OSC10, the terminals XTIN and XTOUT are fixed to a high level during the period when the oscillation circuit OSC10 is disabled.

Therefore, a charging current flows from the terminal XTIN to the condenser C1 until a charge corresponding to a potential difference between both ends of the condenser C1 is accumulated in the condenser C1, and a charging current flows from the terminal XTOUT to the condenser C2 until a charge corresponding to a potential difference between both ends of the condenser C2 is accumulated in the condenser C2. Thus, during the period when the oscillation circuit OSC10 is disabled, there is a possibility that the piezoelectric vibrator XO is adversely affected by the charging currents of the condensers C1 and C2 and the high level potential at both ends of the piezoelectric vibrator XO.

On the other hand, in the case of using the oscillation circuit OSC11, the terminals XTIN and XTOUT are fixed to a low level during the period when the oscillation circuit OSC11 is disabled. Therefore, no charging current flows from the terminal XTIN to the condenser C1, and no charging current flows from the terminal XTOUT to the condenser C2. Thus, during the period when the oscillation circuit OSC11 is disabled, it is possible to eliminate the possibility that the piezoelectric vibrator XO is adversely affected by the charging currents of the condensers C1 and C2 and the high level potentials at both ends of the piezoelectric vibrator XO. Accordingly, in the case of using the oscillation circuit OSC11, it is possible to prolong a lifespan of the piezoelectric vibrator XO externally attached to the semiconductor integrated circuit 300.

Next, the sizes of the oscillation circuits OSC10 and OSC11 will be discussed. A case where a CMOS type NAND circuit illustrated in FIG. 6 is applied to the NAND circuit B1 installed in the oscillation circuit OSC10 and a CMOS type NOR circuit illustrated in FIG. 7 is applied to the NOR circuit A2 installed in the oscillation circuit OSC11 will be considered.

Figure 6:
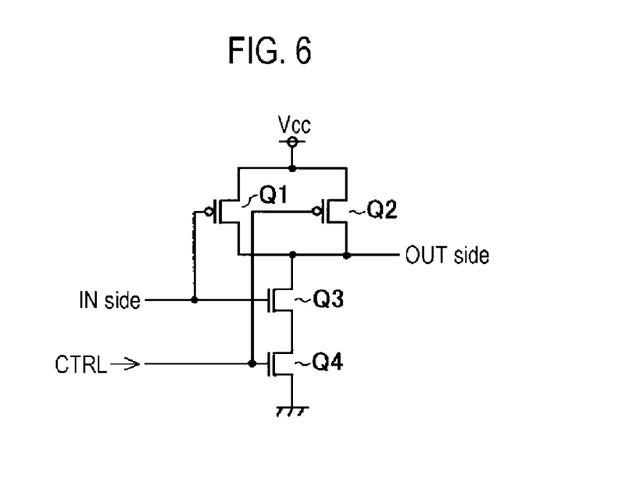
FIG. 6 is a diagram illustrating a configuration of a COS type NAND circuit.
Figure 7:
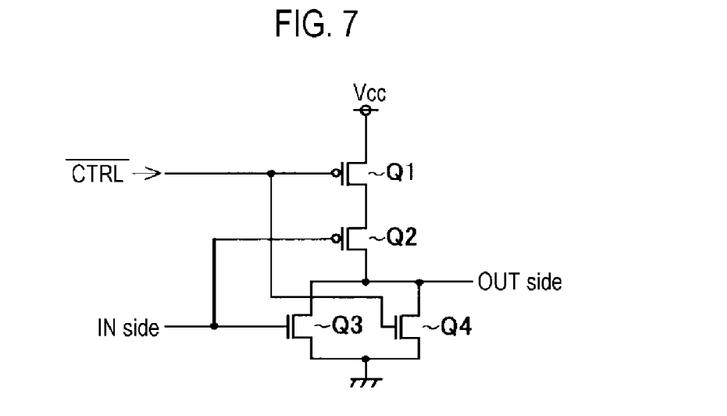
FIG. 7 is a diagram illustrating a configuration of a COS type NOR circuit.

The CMOS type NAND circuit illustrated in FIG. 6 and the CMOS type NOR circuit illustrated in FIG. 7 are both configured by PMOS transistors Q1 and Q2 and NMOS transistors Q3 and Q4.

In the CMOS type NAND circuit illustrated in FIG. 6, a parallel circuit in which the PMOS transistors Q1 and Q2 are connected in parallel and a series circuit in which the NMOS transistors Q3 and Q4 are connected in series are connected in series. On the other hand, in the CMOS type NOR circuit illustrated in FIG. 7, a series circuit in which the PMOS transistors Q1 and Q2 are connected in series and a parallel circuit in which the NMOS transistors Q3 and Q4 are connected in parallel are connected in series.

It is well known that, when current supply capability of the PMOS transistors and current supply capability of the NMOS transistor are set equal, the PMOS transistors become about three times larger than the NMOS transistors.

Therefore, assuming that, when the unit size of the NMOS transistors is "1", the unit size of the PMOS transistors is "3" which is tripled, the size of the CMOS type NAND circuit illustrated in FIG. 6 and the size of the CMOS type NOR circuit illustrated in FIG. 7 are considered. Further, when two transistors are connected in series, since it is necessary to halve the voltage drop of each transistor, the size of each transistor is twice the unit size, i.e., "unit size×2".

Thus, in the CMOS type NAND circuit illustrated in FIG. 6, the size of the PMOS transistor Q1 is "3", the size of the PMOS transistor Q2 is "3", the size of the NMOS transistor Q3 is "1×2", and the size of the NMOS transistor Q4 is "1×2", the total size of which is "10" (=3+3+1×2+1×2). On the other hand, in the CMOS type NOR circuit illustrated in FIG. 7, the size of the PMOS transistor Q1 is "3×2", the size of the PMOS transistor Q2 is "3×2", the size of the NMOS transistor Q3 is "1", and the size of the transistor Q4 is "1", the total size of which is "14" (=3×2+3×2+1+1).

In other words, when the current supply capability of the CMOS type NAND circuit illustrated in FIG. 6 is set equal to the current supply capacity of the CMOS type NOR circuit illustrated in FIG. 7, the CMOS type NOR circuit illustrated in FIG. 7 becomes about 1.4 times (=14÷10) larger than the CMOS type NAND circuit illustrated in FIG. 6. Therefore, when the current supply capacities of the oscillation circuits OSC10 and OSC11 are set equal, the oscillation circuit OSC11 becomes larger than the oscillation circuit OSC10.

As can be seen from the above discussion, in order to avoid a significant size increase of the oscillation circuit, it is necessary to use an oscillation circuit having a configuration not including a NOR circuit, instead of using the oscillation circuit OSC11 having a configuration including the NOR circuit.

Second Embodiment of Oscillation Circuit

Figure 8:
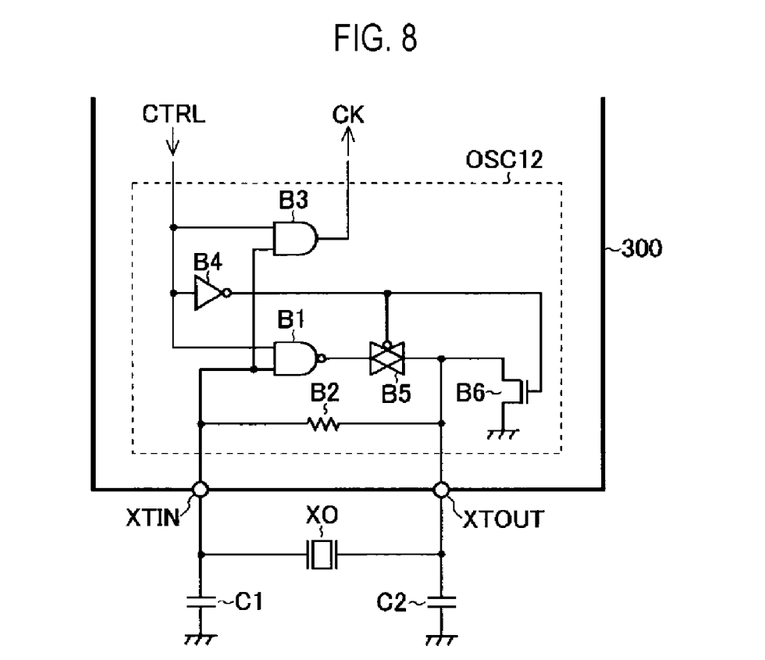
FIG. 8 is a diagram illustrating a second example of an oscillation circuit.

FIG. 8 is a diagram illustrating a second example of the oscillation circuit installed in the semiconductor integrated circuit 300. By allowing an oscillation circuit OSC12 to have a configuration not including a NOR circuit, a configuration having fewer change from the oscillation circuit OSC10 illustrated in FIG. 5 is realized.

The oscillation circuit OSC12 has a configuration in which a NOT circuit B4, a switch B5, and an NMOS transistor B6 are added to the oscillation circuit OSC10. That is, the oscillation circuit OSC12 has a configuration including the NAND circuit B1, the resistor B2, the AND circuit B3, the NOT circuit B4, the switch B5, and the NMOS transistor B6.

A control signal CTRL is supplied to a first input terminal of the NAND circuit B1, a first input terminal of the AND circuit B3, and an input terminal of the NOT circuit B4. The control signal CTRL is a signal generated in the semiconductor integrated circuit 300, has a high level during the first period PD1 described above, and has a low level during the second period PD2 described above. Therefore, the control signal CTRL is generated based on, for example, a clock signal CK and a trigger signal output from the microcomputer 400.

A second input terminal of the NAND circuit B1 is connected to a second input terminal of the AND circuit B3, one end of the resistor B2, and a terminal XTIN. An output terminal of the NAND circuit B1 is connected to one end of the switch B5. The other end of the switch B5 is connected to the other end of the resistor B2, a drain of the NMOS transistor B6, and a terminal XTOUT.

An output terminal of the NOT circuit B4 is connected to an opening/closing control terminal of the switch B5 and a gate of the NMOS transistor B6. The switch B5 is an opening/closing switch which is opened when the potential of the opening/closing control terminal has a high level and which is closed when the potential of the opening/closing control terminal has a low level. The potential of the source of the NMOS transistor B6 is fixed to a low level (typically, a ground potential).

One end of a piezoelectric vibrator XO which is an external component and one end of a condenser C1 which is an external component are connected to the terminal XTIN of the semiconductor integrated circuit 300. Further, the other end of the piezoelectric vibrator XO and one end of a condenser C2 which is an external component are connected to the terminal XTOUT of the semiconductor integrated circuit 300. The potentials of the other ends of the condensers C1 and C2 are fixed to a low level (typically, a ground potential).

The oscillation circuit OSC12 oscillates the piezoelectric vibrator XO to generate the clock signal CK, and outputs the same from an output terminal of the AND circuit B3. Further, the oscillation circuit OSC12 intermittently generates the clock signal CK based on the control signal CTRL. That is, when the control signal CTRL has a high level, the oscillation circuit OSC12 is enabled to generate the clock signal CK, and when the control signal CTRL has a low level, the oscillation circuit OSC12 is disabled and does not generate the clock signal CK.

When the oscillation circuit OSC12 is disabled, the output terminal of the AND circuit B3 is fixed to a low level. Further, when the oscillation circuit OSC12 is disabled, the switch B5 is opened and the NMOS transistor B6 is turned on and thus the terminals XTIN and XTOUT are fixed to a low level.

Thus, similar to the oscillation circuit OSC11, the oscillation circuit OSC12 can prolong a lifespan of the piezoelectric vibrator XO externally attached to the semiconductor integrated circuit 300. In addition, unlike the oscillation circuit OSC11, since the oscillation circuit OSC12 has a configuration not including a CMOS type NOR circuit but including a CMOS type NAND circuit, it is possible to realize a configuration with fewer change from the oscillation circuit OSC10 illustrated in FIG. 5.

<Applications of Sensor System>

Figure 9:
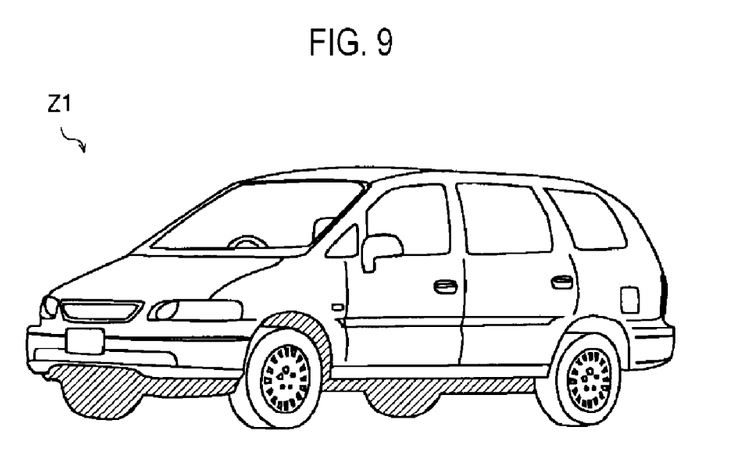
FIG. 9 is an external view of a vehicle on which a sensor system is mounted.

The aforementioned sensor system is mounted on, for example, a vehicle Z1 illustrated in FIG. 9. For example, the ultrasonic sensors 100 and 200 are disposed on a recirculation (exhaust gas recirculation) path connecting an intake path and an exhaust path of an internal combustion engine, and the aforementioned sensor system may be used as a sensor system for measuring a flow rate of a gas flowing through the recirculation path.

<Notes>

In addition to the aforementioned embodiment, various technical features disclosed herein may be differently modified without departing from the gist of the technical creation of the present disclosure.

For example, in the aforementioned embodiment, the sensor signal processing apparatus that processes the sensor signal output from the ultrasonic sensor has been described, but the sensor is not limited to the ultrasonic sensor, and for example, the sensor may be a temperature sensor, a pressure sensor, an acceleration sensor, an angular velocity sensor, or the like.

In some cases, a sensor such as an acceleration sensor or an angular velocity sensor incorporates a piezoelectric vibrator or a silicon vibrator formed by using an MEMS technology therein and performs sensing using vibration of the vibrator, the semiconductor integrated circuit 300 includes an oscillator circuit that oscillates the vibrator incorporated in the sensor, and the sensor signal processing apparatus processes an sensor signal output from the sensor. In these cases, in order to prolong a lifespan of the vibrator incorporated in the sensor, it is desirable that the oscillation circuit that oscillates the vibrator incorporated in the sensor has the same configuration as that of, for example, the oscillation circuit OSC11 or OSC12 described above. The oscillation circuit for oscillating the vibrator incorporated in the sensor, which has the same configuration as that of, for example, the oscillation circuit OSC11 or OSC12 described above, may be implemented together with the first embodiment or the second embodiment described above, or separately from the first embodiment or the second embodiment described above.

Further, it is desirable to use an element (hereinafter, referred to as a "high withstand voltage element") having a withstand voltage higher than that of elements constituting a logic circuit using the clock signal CK in the oscillation circuit OSC11 or OSC12 described above. By using the high withstand voltage element in the oscillation circuit OSC11 or OSC12 described above, it is possible to lower the current supply capability of the element, and to reduce the power consumption of the oscillation circuit OSC11 or OSC12 described above. On the other hand, when the current supply capability of the oscillation circuit OSC11 or OSC12 described above is insufficient, a required current supply capability may be secured by combining the high withstand voltage element and an element having a withstand voltage lower than that of the high withstand voltage element in the oscillation circuit OSC11 or OSC12 described above. Furthermore, since an off-leak current is also reduced in the high withstand voltage element, it is possible to reduce the leak current during the second period PD2 illustrated in FIG. 3 by using the high withstand voltage element in the oscillation circuit OSC11 or OSC12 described above, and also to reduce the power consumption during the second period PD2 illustrated in FIG. 3.

Moreover, unlike the aforementioned embodiment, the oscillation circuit may be enabled when the control signal CTRL has a low level by changing the arrangement of the NOT circuit in the oscillation circuits OSC11 and OSC12. That is, the aforementioned embodiment is merely illustrative in all aspects and should not be understood as limiting, and the technical scope of the present disclosure is not presented by the description of the aforementioned embodiment but presented by accompanying claims. Thus, it is to be understood that it includes all modifications that fall within the meaning and scope of the claims and their equivalents.

According to the semiconductor integrated circuit, the sensor system and the vehicle of the present disclosure in some embodiments, the potentials of a first terminal and a second terminal are fixed to a low level during a period when an oscillation circuit does not oscillate a vibrator. Therefore, during the period when the oscillation circuit does not oscillate the vibrator, it is possible to eliminate a possibility that the vibrator externally connected to the first terminal and the second terminal is adversely affected by a current and a high potential. Thus, it is possible to prolong a lifespan of the externally attached vibrator.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor integrated circuit constituting a part of a sensor signal processing apparatus for processing a sensor signal output from a sensor, the circuit comprising:
   a first terminal to which one end of a vibrator externally attached to the semiconductor integrated circuit is connected;

a second terminal to which the other end of the vibrator is connected; and an oscillation circuit configured to oscillate the vibrator connected via the first terminal and the second terminal, wherein the oscillator circuit is configured to intermittently oscillate the vibrator based on a control signal, wherein a first period during which the oscillation circuit oscillates the vibrator and a second period during which the oscillation circuit does not oscillate the vibrator are alternately switched, wherein, during the first period, potentials of the first terminal and the second terminal are alternately switched complementarily to a high level and a low level, and wherein, during the second period, the potentials of the first terminal and the second terminal are fixed to the low level.

2. The circuit of claim 1, wherein the first period is shorter than the second period.

3. The circuit of claim 1, wherein the sensor signal processing apparatus is configured to process the sensor signal a plurality of times during the first period.

4. The circuit of claim 1, wherein the oscillation circuit is configured to oscillate the vibrator to generate the clock signal.

5. The circuit of claim 4, wherein a length of the first period is determined based on the clock signal.

6. The circuit of claim 1, wherein the vibrator is incorporated in the sensor.

7. The circuit of claim 1, wherein a start timing of the first period is determined based on a trigger signal supplied from the outside of the semiconductor integrated circuit to the semiconductor integrated circuit.

8. The circuit of claim 1, wherein the oscillation circuit comprises:

an NAND circuit;

a first switch installed between an output terminal of the NAND circuit and the second terminal;

a second switch installed between a portion where a potential is fixed to the low level and the second terminal; and a resistor whose one end is connected to the first terminal and other end is connected to the second terminal, wherein during the first period, the first switch is turned on and the second switch is turned off, and wherein, during the second period, the first switch is turned off and the second switch is turned on.

9. The circuit of claim 8, wherein the first switch and the second switch are controlled based on the control signal.

10. The circuit of claim 8, wherein the NAND circuit is a CMOS type NAND circuit.

11. A sensor system, comprising:

a sensor; and a sensor signal processing apparatus comprising the semiconductor integrated circuit of claim 1 and configured to process a sensor signal output from the sensor.

12. A vehicle comprising the sensor system of claim 11.

* * * * *